(12) United States Patent
Lu et al.

(10) Patent No.: US 8,665,030 B2
(45) Date of Patent: Mar. 4, 2014

(54) VOLTAGE-CONTROLLED OSCILLATOR

(75) Inventors: Ying-Ta Lu, Fanlu Township (TW); Hsien-Yuan Liao, Huatan Township (TW); Hsiao-Tsung Yen, Tainan (TW); Ho-Hsiang Chen, Hsinchu (TW); Chewn-Pu Jou, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/325,442

(22) Filed: Dec. 14, 2011

(65) Prior Publication Data

US 2013/0154752 A1   Jun. 20, 2013

(51) Int. Cl.
*H03B 5/12* (2006.01)

(52) U.S. Cl.
USPC ............... 331/117 FE; 331/185; 331/175

(58) Field of Classification Search
USPC ............ 331/170, 45, 117 R, 117 FE, 167
See application file for complete search history.

(56) References Cited

U.S. PATENT DOCUMENTS

| | | | |
|---|---|---|---|
| 6,680,657 B2 * | 1/2004 | Wang et al. ............... | 331/177 V |
| 6,798,308 B2 * | 9/2004 | Sanduleanu et al. .......... | 331/175 |
| 7,463,106 B2 * | 12/2008 | Shin et al. .................... | 331/167 |
| 7,486,154 B1 | 2/2009 | Tan et al. | |
| 7,609,720 B2 | 10/2009 | Ozaki | |
| 7,616,072 B2 * | 11/2009 | Widmer ........................ | 331/173 |
| 7,671,689 B2 * | 3/2010 | Deng et al. .................... | 331/167 |
| 2003/0090332 A1 * | 5/2003 | Aikawa et al. ............... | 331/100 |
| 2008/0309435 A1 * | 12/2008 | Wu ................................ | 333/204 |
| 2010/0277250 A1 * | 11/2010 | Aga et al. .................. | 331/117 R |

OTHER PUBLICATIONS

Kim, Huijung et al., "A Lowe Phase-Noise CMOS VCO with Harmonic Tuned LC Tank", IEEE Transactions on Microwave Theory and Techniques, vol. 54, No. 7, Jul. 2006, pp. 2917-2924.

* cited by examiner

*Primary Examiner* — Ryan Johnson
(74) *Attorney, Agent, or Firm* — Lowe Hauptman & Ham, LLP

(57) ABSTRACT

A voltage-controlled oscillator circuit includes a first transistor, a second transistor, a first resonator circuit, a second resonator circuit, a first current path and a second current path. A drain of the first transistor is coupled to a gate of the second transistor and to a first end of the first resonator circuit. A source of the first transistor is coupled to the first current path and to a first end of the second resonator circuit. A drain of the second transistor is coupled to a gate of the first transistor and to a second end of the first resonator circuit. A source of the second transistor is coupled to the second current path and a second end of the second resonator circuit.

19 Claims, 9 Drawing Sheets

VOLTAGE-CONTROLLED OSCILLATOR

FIELD

The present disclosure is related to a voltage-controlled oscillator.

BACKGROUND

Voltage-controlled oscillators (VCO) are commonly used in a phase-locked loop (PLL), a reference clock, a frequency synthesizer, etc., in both wireless and wire line communication systems. Phase noise is a parameter of the VCO indicating the quality of the VCO signals. The total phase noise in a VCO includes the noise generated by the transistors in the vicinity of the flicker frequency and the integer multiples of the oscillation frequency of the VCO. The oscillation frequency is commonly called the fundamental frequency or the resonant frequency. The value 1/f is used to refer to the flicker frequency where f is the frequency of the noise. Generally, the flicker noise dominates the $1/f^3$ shaped part of the noise spectrum, while the thermal noise dominates the $1/f^2$ shaped part of the noise spectrum.

As complementary metal oxide semiconductor (CMOS) technology downscales, the 1/f flicker frequency of transistors in the VCO tends to increase due to the smaller size of the transistors. As a result, the inductor quality factor referred to as the value Q and the phase noise of the CMOS VCO become worse due to the small distance between the metal and the substrate of the transistors.

In an approach, an inductor capacitor (LC) resonator circuit is added as a load in the LC tank of the VCO to affect the frequency tuning range and the inductor value Q of the VCO. The phase noise contributed by the flicker noise, however, is not suppressed effectively.

In another approach, the VCO is configured such that the LC resonator circuit functions as an open circuit at the oscillation frequency and is electrically shorted at the $2^{nd}$ harmonic frequency. In this approach, the phase noise generated from the noise down-conversion around the $2^{nd}$ harmonic frequency is suppressed by the circuit that is electrically shorted at the $2^{nd}$ harmonic frequency. The phase noise contributed by the flicker noise, again, is not suppressed effectively.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
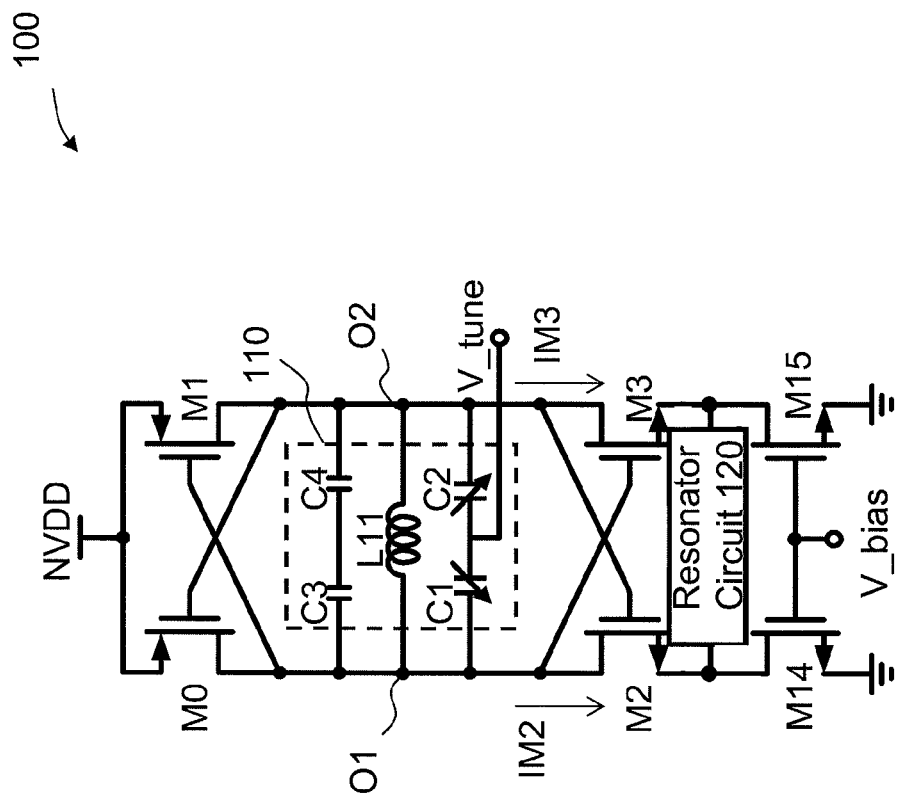
FIG. 1 is a diagram of a voltage-controlled oscillator (VCO) circuit, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. In some embodiments, a supplemental resonator circuit is used in the VCO circuit. The supplemental resonator circuit provides low impedance and thus functions as a short circuit at the oscillation frequency of the VCO circuit. The supplemental resonator circuit, in contrast, provides high impedance and thus functions as an open circuit at other frequencies including the low frequency, the flicker noise frequency, and the $2^{nd}$ harmonic frequency. As a result, the phase noise and flicker noise from the noise down-conversion around the $2^{nd}$ harmonic frequency are reduced and/or suppressed. No extra load is added to an LC tank of the VCO circuit like other approaches. Consequently, the inductive factor Q and the tuning range of the LC tank are not degraded.

Voltage-Controlled Oscillator Circuit

FIG. 1 is a diagram of a voltage-controlled oscillator circuit (VCO) 100, in accordance with some embodiments.

Resonator circuit 110 includes capacitors C1, C2, C3, and C4 and inductor L11 that define the resonant or the oscillation frequency fosc (not labeled) of VCO circuit 100. Voltage V_tune is used to tune the frequency of circuit 110. In some embodiments, circuit 110 causes outputs O1 and O2 to oscillate at an oscillation frequency fosc and an angle oscillation frequency $\omega_{osc}$ wherein $\omega_{osc}=2\pi$ fosc, and $\pi$ is a mathematical constant. Determining a value for frequency fosc or $\omega_{osc}$ should be recognizable by persons of ordinary skill in the art.

PMOS transistors M0 and M1 form a first cross-coupled pair. The gate of transistor M0 is coupled to the drain of transistor M1, and the gate of transistor M1 is coupled to the drain of transistor M0. The sources of transistors M0 and M1 are coupled to node NVDD having operational voltage VDD (not labeled).

NMOS transistors M2 and M3 form a second cross-coupled pair. The gate of transistor M2 is coupled to the drain of transistor M3, and the gate of transistor M3 is coupled to the drain of transistor M2.

NMOS transistors M14 and M15 function as current paths for VCO circuit 100. For example, at frequencies other than the oscillation frequency fosc of VCO circuit 100, circuit 120 functions as an open circuit. Therefore, transistors M2 and M3, electrically, do not form a cross coupled pair because the sources of transistors M2 and M3 are not electrically coupled together. As a result, transistor M14 serves as a current path for transistor M2 while transistor M15 serves as a current path for transistor M3. Control voltage V_bias at the gates of transistors M14 and M15 is selected together with transistors M14 and M15 to handle currents IM2 and IM3 flowing through respective transistors M2 and M3. The ability of transistors M14 and M15 to handle current IM2 and IM3 is proportional to voltage V_bias and to the size of respective transistors M14 and M15. For example, if voltage V_bias is large, transistors M14 and M15 can handle larger currents IM2 and IM3, respectively. In contrast, if voltage V_bias is smaller, transistors M14 and M15 can handle smaller currents IM2 and IM3. Similarly, if transistors M14 and M15 are larger transistors, transistors M14 and M15 can handle larger currents IM2 and IM3. In contrast, if transistors M14 and M15 are smaller transistors, transistors M14 and M15 can handle smaller currents IM2 and IM3. In some embodiments, currents IM2 and IM3 are selected based on a design specification for VCO circuit 100. For example, the design target and specification specify the current consumption of VCO circuit 100 to be less than a predetermined value, which, in some embodiments, is 4 mA. Each of the currents IM2 and IM3 is accordingly designed to be less than 4 mA. Current sources or other circuits functioning as current paths in place of transistors M14 and M15 are within the scope of various embodiments.

In some embodiments, the supplemental resonator circuit 120 includes an inductor-capacitor (LC) network. In such embodiments, supplemental resonator circuit 120 provides low impedance at oscillation frequency fosc of VCO circuit 100 and high impedance at other frequencies including the $2^{nd}$ harmonic frequency. When supplemental resonator circuit 120 provides low impedance, the sources of transistors M2 and M3 are electrically shorted together and to ground. Supplemental resonator circuit 120 thus electrically functions as a short circuit. As a result, VCO circuit 100 achieves the desired oscillation defined by resonator circuit 110 with the assistance of supplemental resonator circuit 120. Further, the oscillation is stable at oscillation frequency fosc.

In contrast, when supplemental resonator circuit 120 provides high impedance, supplemental resonator circuit 120 electrically functions as an open circuit. As a result, transistor M14 serves as a current path for transistor M2, and transistor M15 serves as a current path for transistor M3. Consequently, the flicker noise and the $2^{nd}$ harmonic noise of transistor M2 is degenerated or suppressed by the effective impedance of transistor M14. Similarly, the noise of transistor M3 is degenerated or suppressed by the effective impedance of transistor M15.

In some embodiments, the supplemental resonator circuit 120 includes transmission lines and capacitors. In such embodiments, supplemental resonator circuit 120 provides low impedance and functions as a short circuit at oscillation frequency fosc. In contrast, supplemental resonator circuit 120 provides high impedance and thus functions as an open circuit at low frequency, such as the frequency around the direct current (DC) frequency.

The technique used in supplemental resonator circuit 120 to reduce the noise can be called a harmonic-tuned technique.

Various embodiments are advantageous over other approaches that do not include supplemental resonator circuit 120 and transistors M14 and M15. For example, in some approaches that do not include supplemental resonator circuit 120 and transistors M14 and M15, the noise of transistors M2 and M3 is converted to the oscillation frequency and the $2^{nd}$ harmonic frequency of VCO circuit 100.

The Supplemental Resonator Circuit Embodiments that have Inductor and Capacitor Components FIGS. 2A-2E are different circuit diagrams illustrating some embodiments of supplemental resonator circuit 120 in which inductors and capacitors are used. For illustration, in each of FIGS. 2A-2E, capacitance Ceff is the effective or total capacitance of supplemental resonator circuit 120, while inductance Leff is the effective or total inductance of supplemental resonator circuit 120.

Figure 2A:
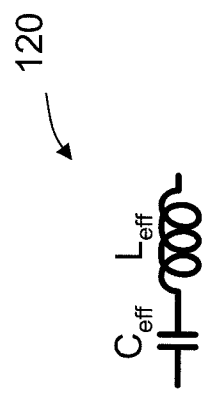
FIGS. 2A-2E are diagrams illustrating some embodiments of the supplemental resonator circuit of the VCO circuit in FIG. 1 in which inductors and capacitors are used.

FIG. 2A is a diagram of supplemental resonator circuit 120 illustrating a configuration of capacitance Ceff being coupled in series with inductance Leff, in accordance with some embodiments. FIGS. 2B-2E are diagrams of capacitors and inductors implemented in different configurations, but include effective capacitance Ceff and effective inductance Leff that are coupled in series as shown in FIG. 2A, in accordance with some embodiments.

Figure 2B:

In FIG. 2B, inductor LB is coupled in between capacitors CB1 and CB2. Effective inductance Leff is the inductance of inductor LB while effective capacitance Ceff is the capacitance of capacitors CB1 and CB2 in parallel. For illustration, LLB represents the inductance of inductor LB while CCB1 and CCB2 represent the capacitances of capacitors CB1 and CB2, respectively.

Mathematically expressed:

$$Ceff=CCB1//CCB2$$

$$Leff=LLB$$

Figure 2C:
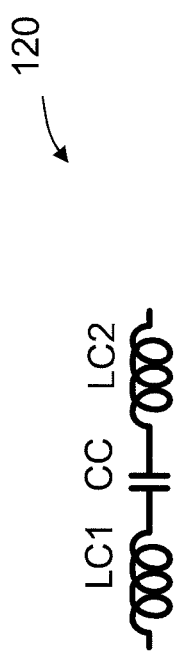

In FIG. 2C, capacitor CC is coupled in between inductors LC1 and LC2. Effective capacitance Ceff is capacitance of capacitor CC. Effective inductance Leff is the sum of inductances of inductors LC1 and LC2. For illustration, CCC represents the capacitance of capacitor CC, and LLC1 and LLC2 represent the inductances of inductors LC1 and LC2, respectively.

Mathematically expressed:

$$Ceff=CCC$$

$$Leff=LLC1+LLC2$$

Figure 2D:
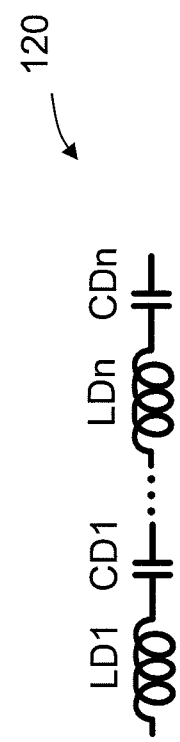

In FIG. 2D, inductor LD1 is coupled in series with capacitor CD1, inductor LD2 (not shown) is coupled in series with capacitor CD2 (not shown), and inductor LDn is coupled in series with capacitor CDn, wherein n is an integer number. As illustratively shown in FIG. 2D, each of a combination of an inductor coupled in series with a capacitor is coupled in series with another combination. As a result, there are n numbers of combinations of inductors coupled in series with n capacitors. For illustration, LLD1, LLD2, . . . , LLDn represent the corresponding inductances of inductors LD1, LD2, . . . , LDn, and CCD1, CCD2, . . . , CCDn represent the capacitances of corresponding capacitors of CD1, CD2, . . . . CDn. Mathematically expressed:

$$Ceff=CCD1//CCD2// \ldots //CCDn \text{ and}$$

$$Leff=LLD1+LLD2+\ldots LLDn$$

Figure 2E:
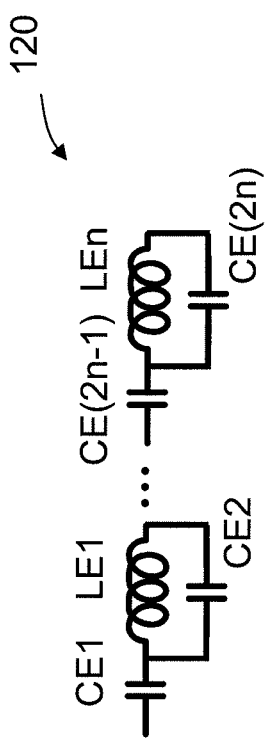

Compared with FIG. 2D, in FIG. 2E, inductors LE1, LE2, . . . , LEn correspond to inductors LD1, LD2, . . . LDn, respectively. Further, each of inductors LE1, LE2, . . . , LEn is coupled in parallel with an additional capacitor. For example, inductor LE1 is coupled in parallel with capacitor CE2, inductor LE2 is coupled in parallel with capacitor CE4, . . . , inductor LEn is coupled in parallel with capacitor CE(2n), etc.

For illustration, capacitors CE1, CE2, . . . , CE(2n) have corresponding capacitances CCE1, CCE2, CCE(2n), and inductors LE1, LE2, . . . , LEn have corresponding inductance LLE1, LLE2, . . . , LLEn. Mathematically expressed:

$$Ceff=CCE1//CCE2// \ldots CCE(2n).$$

Further, $$L_{eff} = \frac{\omega(LLE1)}{1-\omega^2(LLE1)(CCE2)} + \ldots + \frac{\omega(LLEn)}{1-\omega^2(LLEn)(CCE(2n))}$$

Wherein
ω represents the corner frequency, and ω=2πf
For illustration, $\omega_{osc}$ represents the angle oscillation frequency of VCO circuit 100. In some embodiments:

$$\omega_{osc} = \frac{1}{\sqrt{L_{eff} \cdot C_{eff}}}$$

In some embodiments, once $\omega_{osc}$ is known, effective inductance Leff and effective capacitance Ceff are selected accordingly. Selecting a value for each of inductance Leff and capacitance Ceff is based on various factors. For example, a large value of effective inductance Leff with a small value of effective capacitance Ceff would result in large impedance due to the large parasitic resistance of a large inductor. Further, in some embodiments that use the CMOS manufacturing process, the factor Q of inductors dominates because the factor Q of inductors is much lower than the factor Q of capacitors. As a result, under the same oscillation frequency fosc, a large inductance value for Leff and a small capacitance value for Ceff also generate large impedance.

In contrast, a small value of effective inductance Leff with a large capacitance value Ceff would result in smaller impedance due to the small parasitic resistance of the small inductor. Smaller impedance corresponds to a smaller insertion loss. In some embodiments, Leff and Ceff are selected to result in a small insertion loss. In some embodiments, a small value of effective inductive Leff and a large value of capacitance Ceff that result in a small insertion loss also result in a better phase noise performance.

In some embodiments, a value of 3.02 nH for inductance Leff is considered large, and a value of 350 fF for capacitance Ceff is considered small. In contrast, a value of 1.2 nH for inductance Leff is considered small, and a value of 950 fF for capacitance Ceff is considered large. Further, an impedance of 50Ω is used as the standard impedance for the transmission line. Impedance lower than 50Ω plus a margin, such as 20Ω, is considered low impedance. Impedance higher than 50Ω plus a margin, such as 100Ω, is considered high impedance. Other impedance values used for other transmission lines and/or other applications are within the scope of various embodiments. Similarly, other impedance values considered as low and/or high impedance values are within the scope of various embodiments. Other inductance values and/or capacitance values considered as large and/or small values are also within the scope of various embodiments.

Figure 3A:
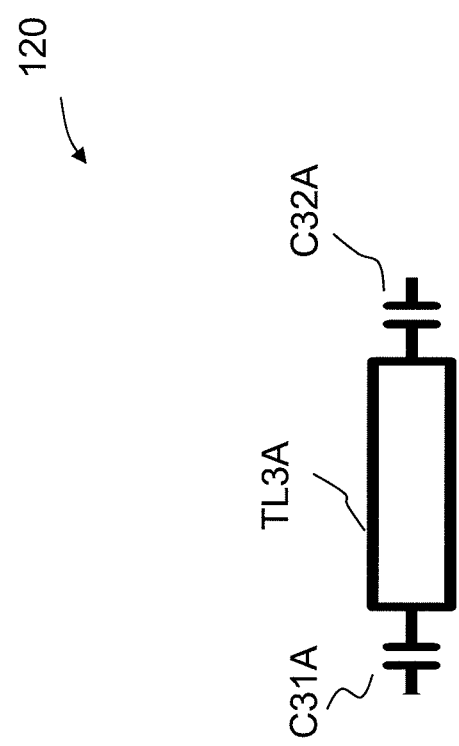
FIGS. 3A and 3B are diagrams illustrating some embodiments of the supplemental resonator circuit of the VCO circuit in FIG. 1 in which transmission lines and capacitors are used.
Figure 3B:
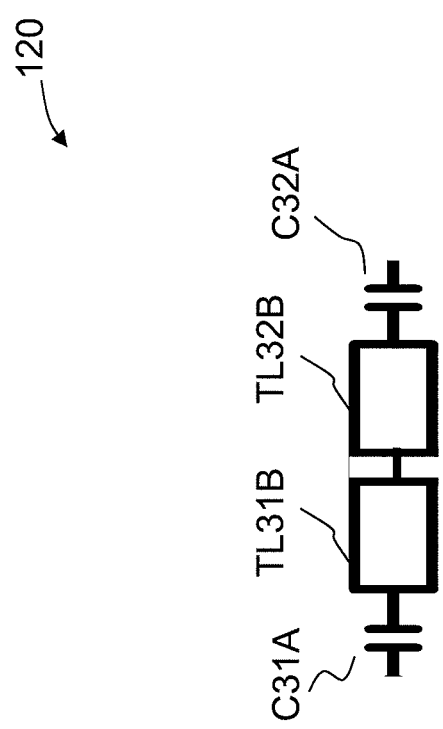

The Supplemental Resonator Circuit Embodiments that have Transmission Line and Capacitor Components FIGS. 3A and 3B are different circuit diagrams illustrating some embodiments of supplemental resonator circuit 120 in which transmission lines and capacitors are used.

In FIG. 3A, a transmission line TL3A is coupled in between capacitors C31A and C32A. In some embodiments, capacitors C31A and C32A have the same capacitance values. In other embodiments, capacitors C31A and C32A have different capacitance values. Further:

$$V_p = \frac{c(light)}{\sqrt{\varepsilon_{eff}}}$$

$$\varepsilon_{eff} = \varepsilon_0 \cdot \varepsilon_r$$

$$V_p = f_{osc} \cdot \lambda$$

wherein
transmission line TL3A has a length of λ/2, and λ represents the wavelength of the oscillation frequency fosc.
Vp represents the propagation velocity.
c(light) represents the speed of light in vacuum, which has a value of 2.99×10$^8$ meter per second (m/s)
$\varepsilon_0$ represent permittivity of free space, which has a value of 8.85×10$^{-12}$ Farrad/meter (F/m).
$\varepsilon_r$ represents the relative permittivity.
$\varepsilon_{eff}$ represents the effective permittivity.
π represents a mathematical constant, which has a value of 3.1416.

In some embodiments, the effective capacitance TCeff (not labeled) of capacitors C31A and C32A is the total capacitance of capacitors C31A and C32A coupled in series. Further, effective capacitance TCeff provides high impedance and supplemental resonator circuit 120 functions as an electrical open circuit at low frequency, such as the frequency around the direct current (DC) frequency. In some embodiments, the lower the frequency, the larger the impedance of effective capacitance TCeff.

In contrast, at the oscillation frequency fosc of VCO circuit 100, transmission line TL3A, capacitor C31A, and capacitor C32A provide low impedance. Supplemental resonator circuit 120 thus functions as an electrical short circuit. In some embodiments, at the oscillation frequency fosc, transmission line TL3A, capacitor C31A, and capacitor C32A are configured to provide a predetermined impedance value, such as about 5Ω, or less. For illustration, Zc represents the impedance of the effective capacitance TCeff, and Zpred represents the predetermined impedance. In some embodiments:

$$Zc = \frac{1}{2\pi \cdot f_{osc} \cdot TC_{eff}} \leq Z_{pred}$$

or $$TC_{eff} \geq \frac{1}{2\pi \cdot f_{osc} \cdot Z_{pred}}$$

In some embodiments, supplemental resonator circuit 120 includes a plurality of transmission lines instead of one transmission line as in FIG. 3A. In such embodiments, the total length of the transmission lines is λ/2.

FIG. 3B is a diagram of supplemental resonator circuit 120 illustrating two transmission lines being used, in accordance with some embodiments. Compared with FIG. 3A, in FIG. 3B, two transmission lines TL31B and TL32B are used in place of transmission line TL3A in FIG. 3A. In some embodiments, the length of each of transmission line TL31B and TL32B is about one half of the length of transmission line TL3A, which is λ/4. The total length of transmission lines TL31B and TL32B is λ/2. Supplemental resonator circuit 120 having a different number of transmission lines is within the scope of various embodiments, and should be recognizable by persons of ordinary skill in the art in view of this document.

In each of FIGS. 3A and 3B, a particular way of connecting the transmission lines and capacitors is used for illustration. For example, in FIG. 3A, transmission line TL3A is coupled between two capacitors C31A and C32A. Different ways of connecting the transmission lines and capacitors are within the scope of various embodiments. For example, in different embodiments, an effective capacitance TCeff results from different ways of connecting capacitors. Similarly, an effective length TLeff of the transmission lines results from different ways of configuring the transmission lines. Effective capacitance TCeff is coupled in series with the transmission lines having an effective length TLeff.

VCO Circuits

Figure 4:
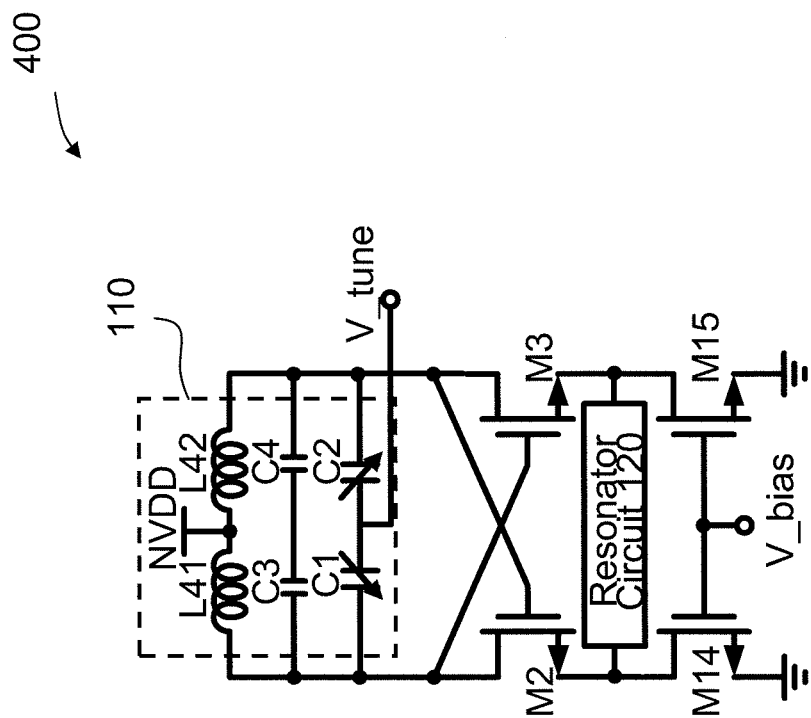
FIGS. 4-6 are diagrams of different VCO circuits, in accordance with some embodiments.

FIG. 4 is a diagram of a VCO circuit 400, in accordance with some embodiments. Compared with VCO circuit 100 in FIG. 1, VCO circuit 400 does not include PMOS transistors M0 and M1. Further, inductors L41 and L42 in FIG. 4 are used in place of inductor L11 in FIG. 1. One end of each of inductors L41 and L42 is coupled to node NVDD. In some embodiments, the inductance value of each of inductors L41 and L42 is half of that of inductor L11 in FIG. 1. Supplemental resonator circuit 120 in VCO circuit 400 functions in a manner similar to supplemental resonator circuit 120 in VCO circuit 100 in FIG. 1.

Figure 5:
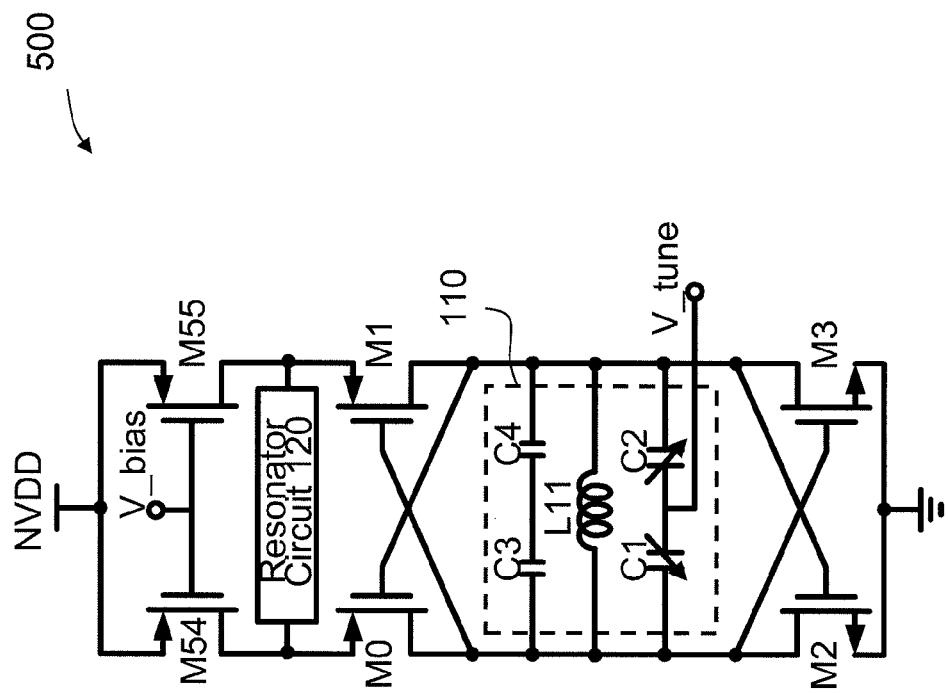

FIG. 5 is a diagram of a VCO circuit 500, in accordance with some embodiments. Compared with VCO circuit 100 in FIG. 1, VCO circuit 500 does not include NMOS transistors M14 and M15. VCO circuit 500, however, additionally includes PMOS transistors M54 and M55 that correspond to NMOS transistors M14 and M15 in FIG. 1. Explained in a different way, PMOS transistors M54 and M55 replace NMOS transistors M14 and M15 in FIG. 1. Because PMOS transistors M54 and M55 replace NMOS transistors M14 and M15, the configuration of various circuit components in FIG. 5 are changed compared with VCO circuit 100 in FIG. 1. For example, the sources of transistors M2 and M3 in FIG. 5 are coupled together and to ground or reference voltage VSS (not shown). Supplemental resonator circuit 120 is coupled to the sources of PMOS transistors M0 and M1, instead of the sources of NMOS transistors M2 and M3, as in FIG. 1. Further, the drains of PMOS transistors M54 and M55 are coupled to the sources of respective PMOS transistors M0 and M1, instead of the sources NMOS transistors M2 and M3, as in FIG. 1.

Functionally, at the oscillation frequency fosc of VCO circuit 500, supplemental resonator circuit 120 functions as an electrical short circuit. As a result, the sources of PMOS transistors M0 and M1 are considered electrically shorted together and operate at a voltage equaling VDD−Vdsat, wherein Vdsat is the saturation voltage of transistors M54 and M55 to keep transistors M54 and M55 operating in a saturation mode. In contrast, at other frequencies including the low frequency, the flicker noise frequency, and the $2^{nd}$ harmonic frequency, supplemental resonator circuit 120 functions as an open circuit. As a result, transistor M54 functions as a current path for transistor M0 while transistor M55 functions as a current path for transistor M1. Consequently, the noise from transistors M0 and M1 are degenerated or suppressed by the impedance of transistors M54 and M55, respectively. Various embodiments of the disclosure are therefore advantageous over other approaches.

Figure 6:
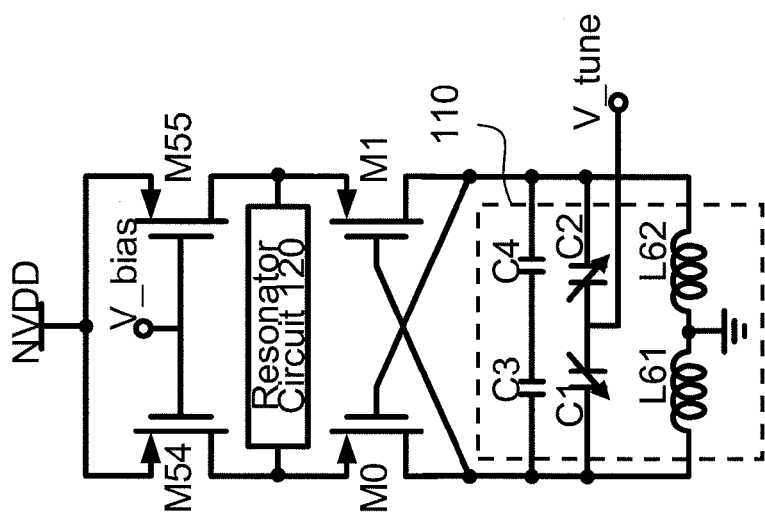

FIG. 6 is a diagram of a VCO circuit 600, in accordance with some embodiments. Compared with circuit 500, circuit 600 does not include NMOS transistors M2 and M3. Inductors L61 and L62 are used in place of inductor L11. One end of each of inductors L61 and L62 is coupled together and to ground or reference voltage VSS (not shown). In some embodiments, the inductance value of each of inductors L61 and L62 is half of that of inductor L11. Supplemental resonator circuit 120 in VCO circuit 600 functions in a manner similar to supplemental resonator circuit 120 functioning in VCO circuit 500.

Exemplary Method

Figure 7:
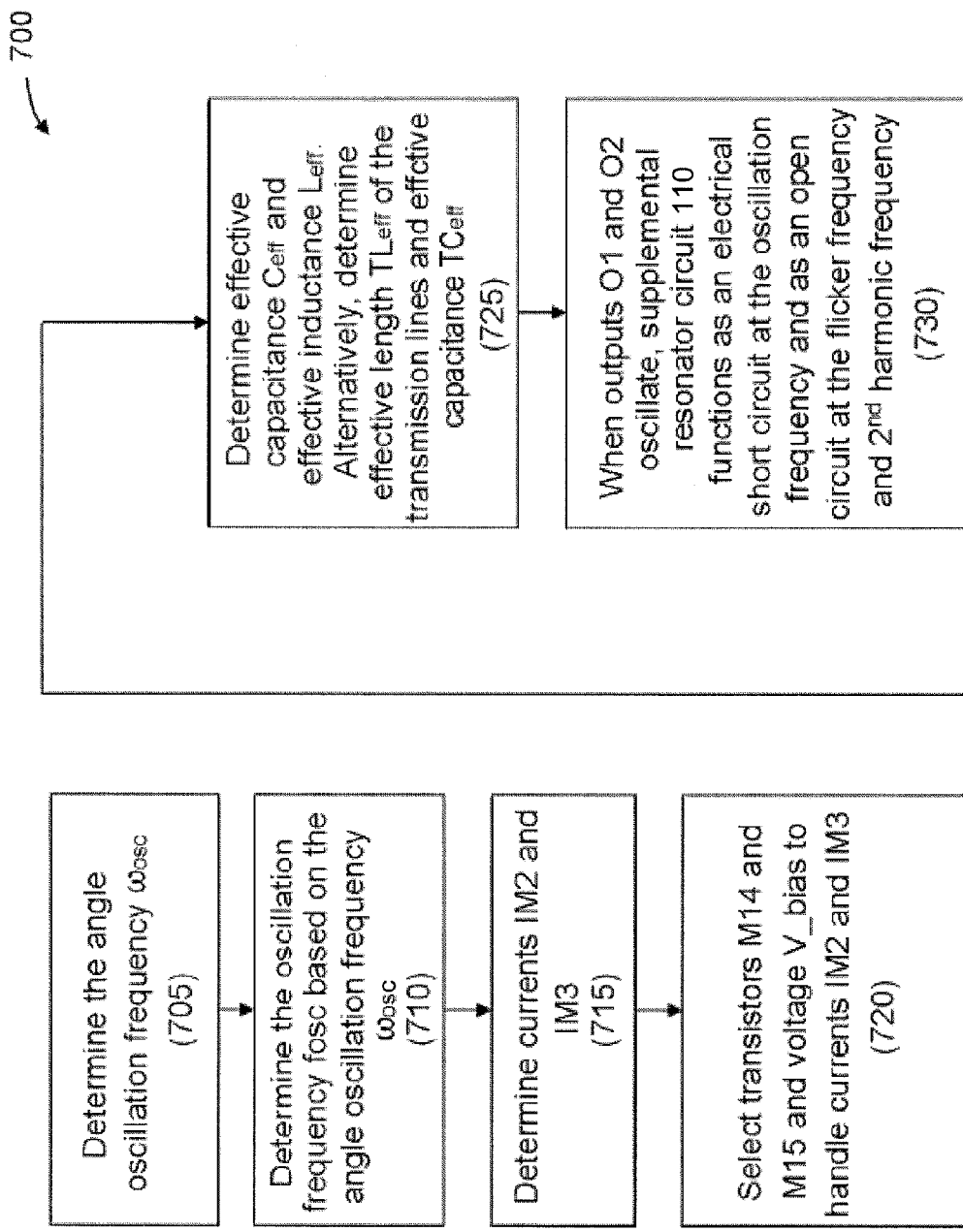
FIG. 7 is a flowchart of a method illustrating how the supplemental resonator circuit in FIG. 1 is formed and used, in accordance with some embodiments.

FIG. 7 is a flowchart of a method 700 illustrating how supplemental resonator circuit 120 is formed and used, in accordance with some embodiments.

In step 705, resonator circuit 110 provides an angle resonant frequency $\omega_{osc}$ that can be determined based on the selected values of capacitors C1, C2, C3, and C4; inductor L11; and voltage V_tune.

In step 710, oscillation frequency fosc is determined based on the equation $\omega_{osc} = 2\pi$ fosc.

In step 715, currents IM2 and IM3 flowing through respective transistors M2 and M3 are determined. In some embodiments, currents IM2 and IM3 are determined based on a design specification to form VCO circuit 100.

In step 720, transistor M14, transistor M15, and voltage V_bias are selected so that transistors M14 and M15 have the ability to handle currents IM2 and IM3, respectively.

In step 725, the values for circuit elements of supplemental resonator circuit 120 are determined. For example, if supplemental resonator circuit 120 includes capacitors and inductors as in FIG. 2A-2E, the effective capacitance Ceff and effective inductance Leff are determined. In some embodiments, the following equation is used:

$$\omega_{osc} = \frac{1}{\sqrt{Leff \cdot Ceff}}$$

If, however, supplemental resonator circuit 120 includes transmission lines and capacitors such as those in FIGS. 3A and 3B, the effective length TLeff of the transmission lines and effective capacitance TCeff are determined.

In step 730, VCO circuit 100 is in operation. At the oscillation frequency fosc, supplemental resonator circuit 120 functions as an electrical short circuit. Outputs O1 and O2 oscillate at the oscillation frequency fosc. At the low frequency, the flicker noise frequency, and $2^{nd}$ harmonic frequency, supplemental resonator circuit 120 functions as an open circuit. As a result, the noise around the 1/f frequency and $2^{nd}$ harmonic frequency of transistors M2 and M3 is reduced or suppressed.

In FIG. 7, VCO circuit 100 is used for illustration. Other VCO circuits, such as circuits 400, 500, and 600 in FIGS. 4, 5, and 6 may be used. The operations of circuits 400, 500, and 600 should be recognizable by persons of ordinary skill in the art in view of this disclosure.

A number of embodiments have been described. It will nevertheless be understood that various modifications may be made without departing from the spirit and scope of the disclosure. For example, various transistors being shown as a particular dopant type (e.g., N-type or P-type metal-oxide semiconductor (NMOS or PMOS)) are for illustration purposes. Embodiments of the disclosure are not limited to a particular type. Selecting different dopant types for a particular transistor is within the scope of various embodiments. The low or high logic level of various signals used in the above description is also for illustration purposes. Various embodiments are not limited to a particular level when a signal is activated and/or deactivated. Selecting different levels is within the scope of various embodiments.

In some embodiments, a voltage-controlled oscillator (VCO) circuit includes a first transistor, a second transistor, a first resonator circuit, a second resonator circuit, a first current path and a second current path. A drain of the first transistor is coupled to a gate of the second transistor and to a first end of the first resonator circuit. A source of the first transistor is coupled to the first current path and to a first end of the second resonator circuit. A drain of the second transistor is coupled to a gate of the first transistor and to a second end of the first resonator circuit. A source of the second transistor is coupled to the second current path and a second end of the second resonator circuit.

In some embodiment, an oscillation frequency of a first resonator circuit of a voltage-controlled oscillator (VCO) circuit is determined. A first current and a second current flowing in the VCO circuit are determined. A first current path and a current path are provided for the VCO circuit. A second resonator circuit is provided. A first end of the second resonator circuit is coupled to the first current path. A second end of the second resonator is coupled to the second current path. The first resonator circuit and the second resonator circuit cause the VCO circuit to oscillate at a first operational condition of the VCO circuit. At a second operational condition of the VCO circuit, the first current path is for use by the first current and the second current path is for use by the second current.

In some embodiments, a first resonator circuit of a voltage-controlled oscillator (VCO) circuit is caused to provide an oscillation frequency for the VCO circuit. A second resonator circuit is caused to serve as an electrically short circuit at an oscillation frequency of the VCO circuit. At a low frequency, a flicker frequency and/or a $2^{nd}$ harmonic frequency of the VCO circuit, the second resonator circuit is caused to serve as an electrically open circuit, a first current of the VCO circuit is caused to flow through a first current path, and a second current of the VCO circuit is caused to flow through a second current path. The first current is different from the second current. The first current path is different from the second current path.

Various figures show the inductor-capacitor circuits using discrete inductors and capacitors for illustration. Equivalent circuitry may be used. For example, an inductive device, circuitry or network (e.g., a combination of inductors, inductive devices, circuitry, etc.) can be used in place of the inductor. Similarly, a capacitive device, circuitry or network (e.g., a combination of capacitors, capacitive devices, circuitry, etc.) can be used in place of the capacitor.

The above methods show exemplary steps, but the steps are not necessarily performed in the order shown. Steps may be added, replaced, changed order, and/or eliminated as appropriate, in accordance with the spirit and scope of disclosed embodiments.

What is claimed is:

1. A voltage-controlled oscillator (VCO) circuit comprising:
   a node;
   a first transistor;
   a second transistor;
   a first resonator circuit;
   a second resonator circuit;
   a first current source coupled between the first transistor and the node; and
   a second current source different from the first current source and coupled between the second transistor and the node,
   wherein
      a drain of the first transistor is coupled to a gate of the second transistor and to a first end of the first resonator circuit;
      a source of the first transistor is coupled to the first current source and to a first end of the second resonator circuit;
      a drain of the second transistor is coupled to a gate of the first transistor and to a second end of the first resonator circuit;
      a source of the second transistor is coupled to the second current source and to a second end of the second resonator circuit; and
      the second resonator circuit is coupled between the source of the first transistor and the source of the second transistor.

2. The VCO circuit of claim 1, further comprising:
   a third transistor; and
   a fourth transistor,
   wherein
      a drain of the third transistor is coupled to a gate of the fourth transistor and to the first end of the first resonator circuit; and
      a drain of the fourth transistor is coupled to a gate of the third transistor and to the second end of the first resonator circuit.

3. The VCO circuit of claim 2, wherein
the first transistor and the second transistor are N-type metal-oxide semiconductor (NMOS) transistors, and the third transistor and the fourth transistor are P-type metal-oxide semiconductor (PMOS) transistors; or
the first transistor and the second transistor are PMOS transistors, and the third transistor and the fourth transistor are NMOS transistors.

4. The VCO circuit of claim 1, wherein
the first current source and/or the second current source is formed by a transistor.

5. The VCO circuit of claim 1, wherein
the second resonator circuit is configured to provide low impedance at a oscillation frequency of VCO circuit and provide high impedance at a low frequency, a flicker frequency, and/or a $2^{nd}$ harmonic frequency of the VCO circuit.

6. The VCO circuit of claim 1, wherein
the second resonator circuit is configured to serve as an electrically short circuit at an oscillation frequency of the VCO circuit and serve as an electrically open circuit at a low frequency, a flicker frequency, and/or a $2^{nd}$ harmonic frequency of the VCO circuit.

7. The VCO circuit of claim 1, wherein
the second resonator circuit includes at least one capacitive device and at least one inductive device;
an effective capacitance of the at least one capacitive device is electrically coupled in series with an effective inductance of the at least one inductive device; and
if $\omega_{osc}$ represents an angle oscillation frequency of the VCO circuit, Leff represents the effective inductance, and Ceff represents the effective capacitance, then the second resonator circuit is configured to satisfy the following equation:

$$\omega_{osc} = \frac{1}{\sqrt{Leff \cdot Ceff}}.$$

8. The VCO circuit of claim 1, wherein
the second resonator circuit includes at least one transmission line coupled with at least one capacitive device;
if TCeff represents an effective capacitance of the at least one capacitive device, Zc represents the effective impedance of the effective capacitance, fosc represents an oscillation frequency of the VCO circuit, Zpred represents a predetermined impedance, π represents a mathematical constant, then the second resonator circuit is configured to satisfy the following equations:

$$Zc = \frac{1}{2\pi \cdot fosc \cdot TCeff} \le Zpred$$

and
if an effective length of the at least one transmission line is $\lambda/2$, $\lambda$ represents a wavelength of the oscillation frequency, Vp represents a propagation velocity, c(light) represents the speed of light in vacuum, $\epsilon_0$ represents a permittivity of free space, $\epsilon_r$ represents a relative permittivity, and $\epsilon_{\mathit{eff}}$ represents an effective permittivity, the second resonator circuit is configured to satisfy the following equations:

$$Vp = \frac{c(\text{light})}{\sqrt{\varepsilon_{\mathit{eff}}}}$$

$$\varepsilon_{\mathit{eff}} = \varepsilon_0 \cdot \varepsilon_r$$

$$Vp = fosc \cdot \lambda.$$

9. The VCO circuit of claim 8, wherein
the at least one capacitive device includes a first capacitive device and a second capacitive device; and
the at least one transmission line is coupled between the first capacitive device and the second capacitive device.

10. A method comprising:
determining an oscillation frequency of a first resonator circuit of a voltage-controlled oscillator (VCO) circuit;
determining a first current flowing through a first transistor of the VCO circuit and a second current flowing through a second transistor of the VCO circuit;
providing a first current source and a second current source different from the first current source for the VCO circuit, the first current source being coupled between the first transistor and a node, and the second current source being coupled between the second transistor and the node;
providing a second resonator circuit, a first end of the second resonator circuit coupled to the first current source, a second end of the second resonator circuit coupled to the second current source,
wherein
the first resonator circuit and the second resonator circuit cause the VCO circuit to oscillate at a first operational condition of the VCO circuit;
at a second operational condition of the VCO circuit, the first current source is for use by the first current and the second current source is for use by the second current;

the first operational condition of the VCO circuit comprises the second resonator circuit providing an impedance lower than a predetermined impedance value; and
the second operational condition of the VCO circuit comprises the second resonator circuit providing an impedance higher than the redetermined impedance value.

11. The method of claim 10, wherein
the first current source and/or the second current source is formed by a transistor.

12. The method of claim 10 wherein
the first current source and the second current source are formed by a respective third transistor and fourth transistor;
a gate of the third transistor and a gate of the fourth transistor are coupled together and configured to receive a control voltage;
a drain of the third transistor is coupled to the first end of the second resonator circuit and a drain of the fourth transistor is coupled to the second end of the second resonator circuit.

13. The method of claim 10, wherein
the second resonator circuit comprises at least one capacitive device and at least one inductive device;
an effective capacitance of the at least one capacitive device is electrically coupled in series with an effective inductance of the at least one inductive device;
if $\omega_{osc}$ represent an angle oscillation frequency of the VCO circuit, Ceff represents a value of the effective capacitance, and Leff represents a value of the effective inductance, then $$\omega_{osc} = \frac{1}{\sqrt{Leff \cdot Ceff}}.$$

14. The method of claim 10, wherein
the second resonator circuit includes at least one transmission line coupled with at least one capacitive device;
if TCeff represents an effective capacitance of the at least one capacitive device, Zc represents the effective impedance of the effective capacitance, fosc represents an oscillation frequency of the VCO circuit, Zpred represents a predetermined impedance, π represents a mathematical constant, then the second resonator circuit is configured to satisfy the following equation:

$$Zc = \frac{1}{2\pi \cdot fosc \cdot TCeff} \le Zpred$$

and
if an effective length of the at least one transmission line is $\lambda/2$, $\lambda$ represents a wavelength of the oscillation frequency, Vp represents a propagation velocity, c(light) represents the speed of light in vacuum, $\epsilon_0$ represents a permittivity of free space, $\epsilon_r$ represents a relative permittivity, and $\epsilon_{\mathit{eff}}$ represents an effective permittivity, the second resonator circuit is configured to satisfy the following equations:

$$Vp = \frac{c(\text{light})}{\sqrt{\varepsilon_{\text{eff}}}}$$

$$\varepsilon_{\text{eff}} = \varepsilon_0 \cdot \varepsilon_r$$

$$Vp = fosc \cdot \lambda.$$

15. The method of claim 14, wherein
the at least one capacitive device includes a first capacitive device and a second capacitive device; and
the at least one transmission line is coupled between the first capacitive device and the second capacitive device.

16. A method comprising:
causing a first resonator circuit of a voltage-controlled oscillator (VCO) circuit to provide an oscillation frequency for the VCO circuit;
causing a second resonator circuit to serve as an electrical short circuit at the oscillation frequency of the VCO circuit; and
at a frequency different from the oscillation frequency of the VCO circuit,
causing the second resonator circuit to serve as an electrical open circuit,
causing a first current of the VCO circuit to flow through a first current source of the VCO, and
causing a second current of the VCO circuit to flow through a second current source of the VCO circuit,
wherein
the first current is different from the second current; and
the first current source is different from the second current source.

17. The method of claim 16, wherein
the second resonator circuit comprises at least one capacitive device and at least one inductive device;
an effective capacitance of the at least one capacitive device is electrically coupled in series with an effective inductance of the at least one inductive device;
if $\omega_{osc}$ represent an angle oscillation frequency of the VCO circuit, Ceff represents a value of the effective capacitance, and Leff represents a value of the effective inductance, then $$\omega_{osc} = \frac{1}{\sqrt{Leff \cdot Ceff}}.$$

18. The method of claim 16, wherein
the second resonator circuit includes at least one transmission line coupled with at least one capacitive device;
if TCeff represents an effective capacitance of the at least one capacitive device, Zc represents the effective impedance of the effective capacitance, fosc represents an oscillation frequency of the VCO circuit, Zpred represents a predetermined impedance, $\pi$ represents a mathematical constant, then the second resonator circuit is configured to satisfy the following equation:

$$Zc = \frac{1}{2\pi \cdot fosc \cdot TCeff} \leq Zpred$$

and
if an effective length of the at least one transmission line is $\lambda/2$, $\lambda$ represents a wavelength of the oscillation frequency, Vp represents a propagation velocity, c(light) represents the speed of light in vacuum, $\epsilon_0$ represents a permittivity of free space, $\epsilon_r$ represents a relative permittivity, and $\epsilon_{\text{eff}}$ represents an effective permittivity, the second resonator circuit is configured to satisfy the following equations:

$$Vp = \frac{c(\text{light})}{\sqrt{\varepsilon_{\text{eff}}}}$$

$$\varepsilon_{\text{eff}} = \varepsilon_0 \cdot \varepsilon_r$$

$$Vp = fosc \cdot \lambda.$$

19. The circuit of claim 18, wherein
the at least one capacitive device includes a first capacitive device and a second capacitive device; and
the at least one transmission line is coupled between the first capacitive device and the second capacitive device.

* * * * *